(12) United States Patent
Lee et al.

(10) Patent No.: US 11,017,717 B2
(45) Date of Patent: May 25, 2021

(54) ORGANIC LIGHT EMITTING DISPLAY DEVICE AND METHOD FOR DRIVING THE SAME

(71) Applicant: LG DISPLAY CO., LTD., Seoul (KR)

(72) Inventors: Seongku Lee, Paju-si (KR); Binn Kim, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 16/431,976

(22) Filed: Jun. 5, 2019

(65) Prior Publication Data
US 2019/0371235 A1  Dec. 5, 2019

(30) Foreign Application Priority Data
Jun. 5, 2018 (KR) .................. 10-2018-0065013

(51) Int. Cl.
*G09G 3/3225* (2016.01)
*G09G 3/00* (2006.01)
*H01L 51/56* (2006.01)
*H01L 27/32* (2006.01)

(52) U.S. Cl.
CPC .......... *G09G 3/3225* (2013.01); *G09G 3/006* (2013.01); *H01L 27/3276* (2013.01); *H01L 51/56* (2013.01); *G09G 2300/0426* (2013.01); *G09G 2300/0452* (2013.01); *G09G 2310/08* (2013.01); *G09G 2330/08* (2013.01); *H01L 2251/568* (2013.01)

(58) Field of Classification Search
None
See application file for complete search history.

(56) References Cited

U.S. PATENT DOCUMENTS

| | | | | |
|---|---|---|---|---|
| 2007/0229420 A1* | 10/2007 | Hwang | ................. | G09G 3/006 345/87 |
| 2009/0033823 A1* | 2/2009 | Chung | .............. | G02F 1/136259 349/54 |
| 2009/0167976 A1* | 7/2009 | Chung | .............. | G02F 1/136259 349/54 |
| 2010/0051958 A1* | 3/2010 | Izumida | .............. | H01L 51/5228 257/72 |
| 2013/0120230 A1* | 5/2013 | Chen | ........................ | G09G 3/20 345/92 |
| 2014/0111504 A1* | 4/2014 | Lee | .................... | G02F 1/134363 345/214 |
| 2015/0102312 A1* | 4/2015 | Lee | ....................... | G09G 3/3233 257/40 |
| 2015/0161943 A1* | 6/2015 | Shim | .................... | G09G 3/3225 345/76 |
| 2016/0189593 A1* | 6/2016 | Lee | ....................... | G09G 3/3291 345/691 |

* cited by examiner

*Primary Examiner* — Christopher R Lamb
(74) *Attorney, Agent, or Firm* — Polsinelli PC

(57) ABSTRACT

An organic light emitting display panel includes a plurality of pixels arranged in a row direction; a first repair line disposed in the row direction; a plurality of auxiliary bridges, each arranged between the first repair line and each of the plurality of pixels; a plurality of first bridge patterns respectively connected to the plurality of pixels and each first bridge pattern partially overlapping each adjacent auxiliary bridge; and a plurality of second bridge patterns branched from the first repair line and each second bridge pattern partially overlapping each adjacent auxiliary bridge.

15 Claims, 9 Drawing Sheets

ORGANIC LIGHT EMITTING DISPLAY DEVICE AND METHOD FOR DRIVING THE SAME

CROSS-REFERENCE TO RELATED APPLICATION

This application claims the priority benefit of Korean Patent Application No. 10-2018-0065013 filed on Jun. 5, 2018, which is incorporated herein by reference in its entirety.

BACKGROUND

Field of the Disclosure

The present disclosure relates to a display device, and more particularly, to an organic light emitting display panel and an organic light emitting display device including the same. Although the present disclosure is suitable for a wide scope of applications, it is particularly suitable for improving manufacturing yield that can be lowered by defective pixels in the organic light emitting display panel and an organic light emitting display device including the same.

Discussion of the Background

An active matrix type organic light emitting display device includes a self-luminous organic light emitting diode (OLED) that can implement high response speed, high luminous efficiency and brightness and a wide viewing angle.

The OLED includes an anode electrode, a cathode electrode, and organic compound layers (HIL, HTL, EML, ETL, and EIL) formed therebetween. The organic compound layer includes a hole injection layer (HIL), a hole transport layer (HTL), an emission layer (EML), an electron transport layer (ETL), and an electron injection layer (EIL). When a driving voltage is applied to the anode electrode and the cathode electrode, holes passing through the HTL and electrons passing through the ETL migrate to the EML to form excitons, and as a result, the EML emits visible light.

Defective pixels may occur during a process of manufacturing organic light emitting display devices, and thus, various methods have been sought to improve a reduction in yield due to the defective pixels

SUMMARY

Accordingly, the present disclosure is directed to a an organic light emitting display panel and an organic light emitting display device including the same that substantially obviate one or more of problems due to limitations and disadvantages of the prior art.

Additional features and advantages of the disclosure will be set forth in the description which follows and in part will be apparent from the description, or may be learned by practice of the invention. Other advantages of the present disclosure will be realized and attained by the structure particularly pointed out in the written description and claims hereof as well as the appended drawings.

To achieve these and other advantages and in accordance with the purpose of the present invention, as embodied and broadly described, an organic light emitting display panel includes a plurality of pixels arranged in a row direction; a first repair line disposed in the row direction; a plurality of auxiliary bridges, each arranged between the first repair line and each of the plurality of pixels; a plurality of first bridge patterns respectively connected to the plurality of pixels and each first bridge pattern partially overlapping each adjacent auxiliary bridge; and a plurality of second bridge patterns branched from the first repair line and each second bridge pattern partially overlapping each adjacent auxiliary bridge.

In another aspect of the present disclosure, an organic light emitting display panel includes a plurality of pixels arranged in a first direction and including a first group of pixels representing a first color and a second group of pixels representing a second color; a first repair line disposed along the plurality of pixels and electrically connected to the first group of pixels; a second repair line disposed parallel to the first repair line and electrically connected to the second group of pixels; a plurality of auxiliary bridges, each arranged between the first repair line and each of the plurality of pixels; a plurality of first bridge patterns respectively connected to the plurality of pixels and each first bridge pattern having a portion overlapping a nearest auxiliary bridge; and a plurality of second bridge patterns including a first group branched from the first repair line, a second group branched from the second repair line and each second bridge pattern having a portion overlapping each nearest auxiliary bridge, wherein the first and second repair lines and the plurality of auxiliary bridges are arranged in a non-display area of the display panel.

In a further aspect of the present disclosure, an An organic light emitting display panel includes a plurality of pixels arranged in a row direction and including a first pixel and a second pixel representing a same color; a first repair line disposed along the plurality of pixels; a second repair line disposed parallel to the first repair line; a plurality of auxiliary bridges, each arranged between the first repair line and each of the plurality of pixels, wherein the plurality of auxiliary bridges includes a first auxiliary bridge adjacent to the first pixels and a second auxiliary bridge adjacent to the second pixel; a plurality of first bridge patterns connected to the first and second pixels; and a plurality of second bridge patterns including a first group of second bridge patterns branched from the first repair line and overlapping the first auxiliary bridge and a second group of second bridge patterns branched from the second repair line and overlapping the second auxiliary bridge.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Reference will now be made in detail to aspects of the disclosure, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the aspects of the disclosure.

Figure 1:
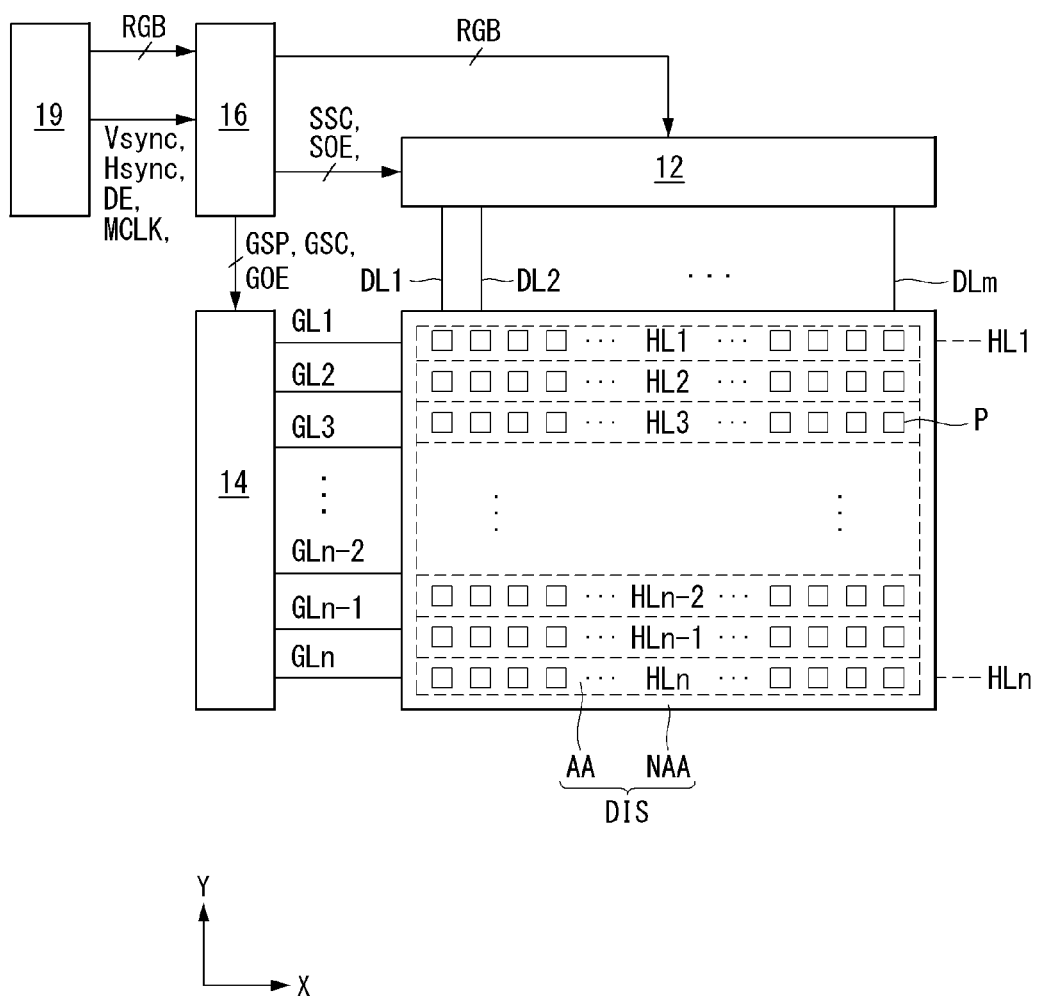
FIG. 1 is a view illustrating an organic light emitting display device according to the present disclosure.

FIG. 1 is a block diagram schematically illustrating an organic light emitting display device.

Referring to FIG. 1, an organic light emitting display device according to an aspect of the present disclosure includes a display panel DIS including a plurality of pixels P, a data driver 12 for driving a plurality of data lines DL1 to DLm, a gate driver 14 for a plurality of driving gate lines GL1 to GLn, and a timing controller 16 for controlling a driving timing of the data driving circuit 12 and the gate driving circuit 14.

The display panel DIS includes a display area AA in which the plurality of pixels P are arranged to display an image and a non-display area NAA in which no image is displayed. The non-display area NAA may surround the display area AA and may be referred to as a bezel.

The plurality of data lines DL1 to DLm and the plurality of gate lines GL1 to GLn intersect each other in the display area AA of the display panel DIS, and pixels P are arranged in a matrix form at the intersections thereof. Each of a plurality of pixel lines HL1 to HLn includes pixels arranged in the same row. Hereinafter, in this disclosure, in FIG. 1, the X direction will be referred to as a row direction and the Y direction will be referred to as a column direction. When the plurality of pixels P arranged in the display area AA is m×n pixels, the display area AA includes n number of pixel lines.

The plurality of pixels P arranged in a first pixel line HL1 are connected to a first gate line GL1 and the plurality of pixels P arranged in an $n^{th}$ pixel line HLn are connected to an $n^{th}$ gate line GL. The plurality of gate lines GL1 to GLn may include a plurality of lines providing gate signals.

Each of the plurality of pixels P may be divided into a red subpixel, a green subpixel, and a blue subpixel or may be divided into a red subpixel, a green subpixel, a blue subpixel, and a white subpixel, for the full color implementation. Each of the subpixels includes a pixel circuit. Hereinafter, a pixel may be interpreted as having the same meaning as a subpixel.

The plurality of pixels P may be commonly supplied with high potential/low potential driving voltages EVDD and EVSS from a power source (not shown).

Transistors constituting the pixels P may be implemented as oxide transistors including an oxide semiconductor layer. The oxide transistor may be advantageous for the large-sized display panel (DIS) in consideration of both electron mobility and process variation. However, the present disclosure is not limited thereto and a semiconductor layer of each transistor can be formed of amorphous silicon, polysilicon, or the like.

The timing controller 16 realigns digital video data RGB input from a host system 19 in accordance with resolution of the display panel DIS and supplies the realigned digital video data RGB to the data driver 12. The timing controller 16 also generates a data control signal for controlling an operation timing of the data driver 12 and a gate control signal for controlling an operation timing of the gate driver 14 based on timing signals such as a vertical synchronization signal Vsync, a horizontal synchronization signal Hsync, a data enable signal DE, and a main clock MCLK. The data control signal includes a source sampling clock (SSC), a source output enable signal (SOE), and the like. The gate control signal includes a gate start pulse (GSP), a gate shift clock (GSC), a gate output enable signal (GOE), and the like.

The data driver 12 converts the digital video data RGB input from the timing controller 16 into an analog data voltage based on the data control signal.

Figure 4:
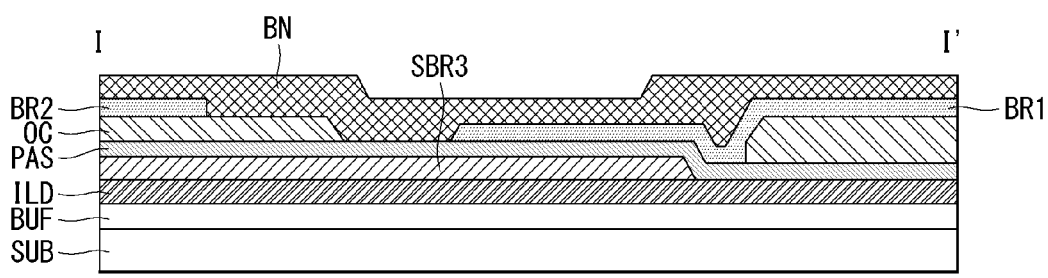
FIG. 4 is a cross-sectional view taken along line I-I' illustrated in FIG. 3.

The gate driver 14 may generate gate signals based on the gate control signal as shown in FIG. 4 in which the gate driver 14 is disposed outside the display panel DIS, but the gate driver 14 may be directly formed on the non-display area NAA of the display panel DIS according to a gate-driver in panel (GIP) scheme.

Figure 2:
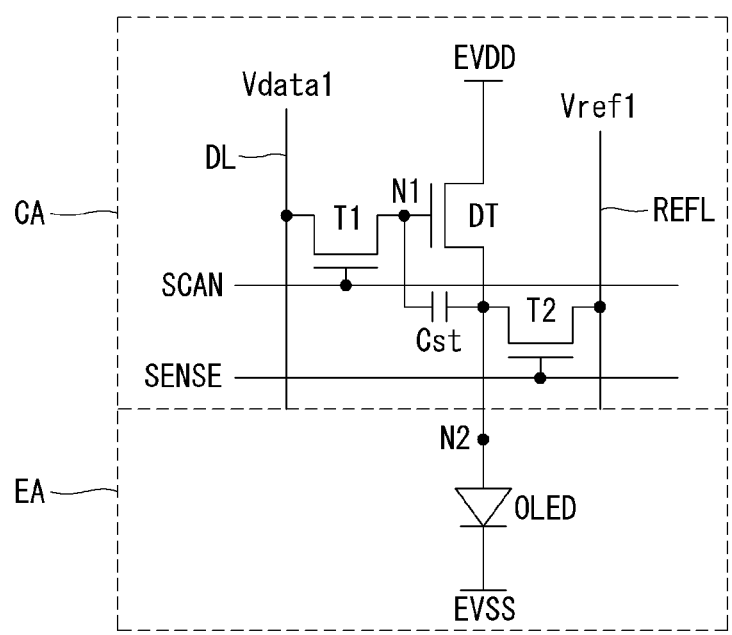
FIG. 2 is a view illustrating a pixel.

FIG. 2 is a view illustrating an example of a pixel in the present disclosure.

Referring to FIG. 2, the pixel P includes a circuit part (or a circuit area) CA and an emission part (or an emission area) EA.

The circuit part CA may include a driving transistor DT, a storage capacitor Cst, a first transistor T1, and a second transistor T2. The driving transistor DT controls a driving current flowing through an organic light emitting diode (OLED) according to a gate-source voltage Vgs. The driving transistor DT may include a gate electrode connected to a first node N1, a drain electrode connected to an input terminal of a high potential driving voltage EVDD, and a source electrode connected to a second node N2. The storage capacitor Cst may be connected between the first node N1 and the second node N2. The first transistor T1 may include a gate electrode connected to an input terminal of a scan signal SCAN, a drain electrode connected to the data line DL, and a source electrode connected to the first node N1. The second transistor T2 may include a gate electrode connected to an input terminal of a sense signal SENSE, a drain electrode connected to the second node N2, and a source electrode connected to a reference voltage line REFL.

The emission part EA may display an image according to brightness of light emitted by the OLED. The OLED may include an anode connected to the second node N2, a cathode connected to an input terminal of a low potential driving voltage EVSS and an organic compound layer positioned between the anode and the cathode.

As shown in FIG. 2, the pixel is illustrated as a circuit which may obtain a voltage of the second node N2 as a sensing voltage and which is applied to an external compensation scheme compensating for driving characteristics on the basis of the obtained sensing voltage. The circuit part of the pixel according to the present disclosure is not limited to the aspect illustrated in FIG. 2. For example, the pixel may be implemented as an internal compensation scheme that automatically compensates for the current flowing through the OLED within the pixel so as not to be affected by a threshold voltage of the driving transistor.

Figure 3:
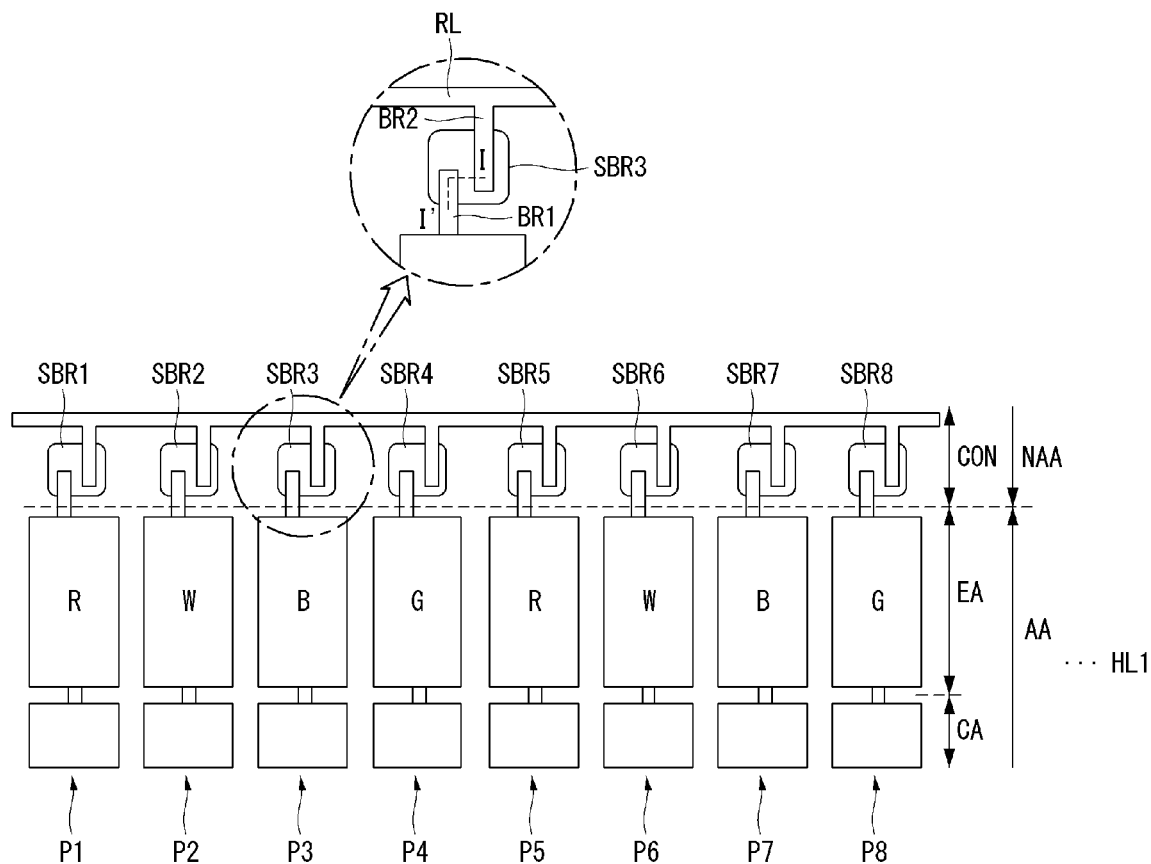
FIG. 3 is a view illustrating a pixel array according to a first aspect of the present disclosure.

FIG. 3 is a view illustrating a repair structure according to a first aspect of the present disclosure.

Referring to FIG. 3, the first aspect of the present disclosure may include a repair part CON adjacent to the first pixel line HL 1 and disposed in the non-display area NAA.

The repair part CON may include a repair line RL and a connection portion.

The repair line RL is arranged in a row direction in the non-display area NAA of the display panel DIS. The connection portion may be disposed between the repair line RL and the emission part EA of each pixel P and forms a current path connecting a defective pixel P to a normal pixel P. The connection portion may include auxiliary bridges SBR1 to SBR8, first bridge patterns BR1, and second bridge patterns BR2.

Each of the auxiliary bridges SBR1 to SBR8 may be disposed between the repair line RL and the pixels P. For example, a first auxiliary bridge SBR1 is disposed between a first pixel P1 and the repair line RL, and a second auxiliary bridge SBR2 is disposed between a second pixel P and the repair line RL. The auxiliary bridges SBR1 to SBR8 may not be electrically connected to each other.

The first bridge patterns BR1 may be electrically connected to the anodes of OLEDs of the pixels and at least partially overlap auxiliary bridges adjacent thereto, among the auxiliary bridges SBR1 to SBR8. For example, the first bridge pattern BR1 of the third pixel P partially may overlap the third auxiliary bridge SBR3 shown in a plan view.

The second bridge patterns BR2 may be branched from the repair line RL and at least partially overlap auxiliary bridges adjacent thereto, among the auxiliary bridges SBR1 to SBR8. For example, the second bridge pattern BR2 adjacent to the third pixel P partially may overlap the third auxiliary bridge SBR3 shown in a plan view. As illustrated in FIG. 3, the second bridge patterns BR2 may be branched from the repair line RL. Alternatively, the second bridge patterns BR2 may be separately formed from the repair line RL and connected to the repair line RL through contact holes or other electrical connection units.

FIG. 4 is a cross-sectional view taken along line I-I' of FIG. 3.

Referring to FIG. 4, a cross-sectional structure of the repair line RL and the pixels P will be described below.

A buffer layer BUF is disposed on a substrate SUB which may be formed of glass or plastic. More specifically, the substrate SUB may be formed of plastic such as polyimide (PI), polyethylene terephthalate (PET), polyethylene naphthalate (PEN), polycarbonate (PC), and the like, and may have flexibility. The buffer layer BUF may serve to block ions or impurities spread from the substrate SUB and moisture penetration from the outside.

An inter-layer dielectric (ILD) is disposed on the buffer layer BUF and the ILD may be formed of a silicon oxide layer (SiOx).

The auxiliary bridge SBR3 may be disposed on the ILD. The auxiliary bridge SBR3 may be formed by using a source/drain metal layer or a gate metal layer constituting a transistor of the circuit part CA. That is, the auxiliary bridge SBR3 may be formed of one of molybdenum (Mo), aluminum (Al), chromium (Cr), gold (Au), titanium (Ti), nickel (Ni), neodymium (Nd), and copper (Cu), or an alloy thereof used in the source/drain metal layer. Alternatively, the auxiliary bridge SBR3 may be formed of one of molybdenum (Mo), aluminum (Al), chromium (Cr), gold (Au), titanium (Ti), nickel (N1), neodymium (Nd), and copper (Cu), or an alloy thereof used in the gate metal layer. A passivation layer PAS may be disposed on the ILD to cover the auxiliary bridge SBR3. The passivation layer (PAS) may be formed of silicon oxide (SiOx), silicon nitride (SiNx), or a multilayer thereof.

A planarizing layer (i.e., overcoat (OC)) may be positioned on the passivation layer PAS and may be located outside a region where the auxiliary bridge SBR3 is disposed. The OC, which serves to planarize an underlying step to compensate for a step of the substrate SUB, may be formed of an organic material such as photoacryl, polyimide, a benzocyclobutene-based resin, an acrylate, and the like.

The first bridge pattern BR1 may be disposed on the OC in the non-display area NAA. The second bridge pattern BR2 may be disposed on the OC and the passivation layer PAS. The first and second bridge patterns BR1 and BR2 may be formed using a metal layer, e.g., indium tin oxide (ITO), which is the same as that of the anode of the OLED. Also, as described above, the repair line RL may be formed of a material, i.e., ITO, which is the same as that of the second bridge pattern BR2.

A bank layer BN is located on the substrate SUB where the first and second bridge patterns BR1 and BR2 are formed thereon. The bank layer BN may be formed of an organic material such as polyimide, benzocyclobutene-based resin and an acrylate.

Figure 5:
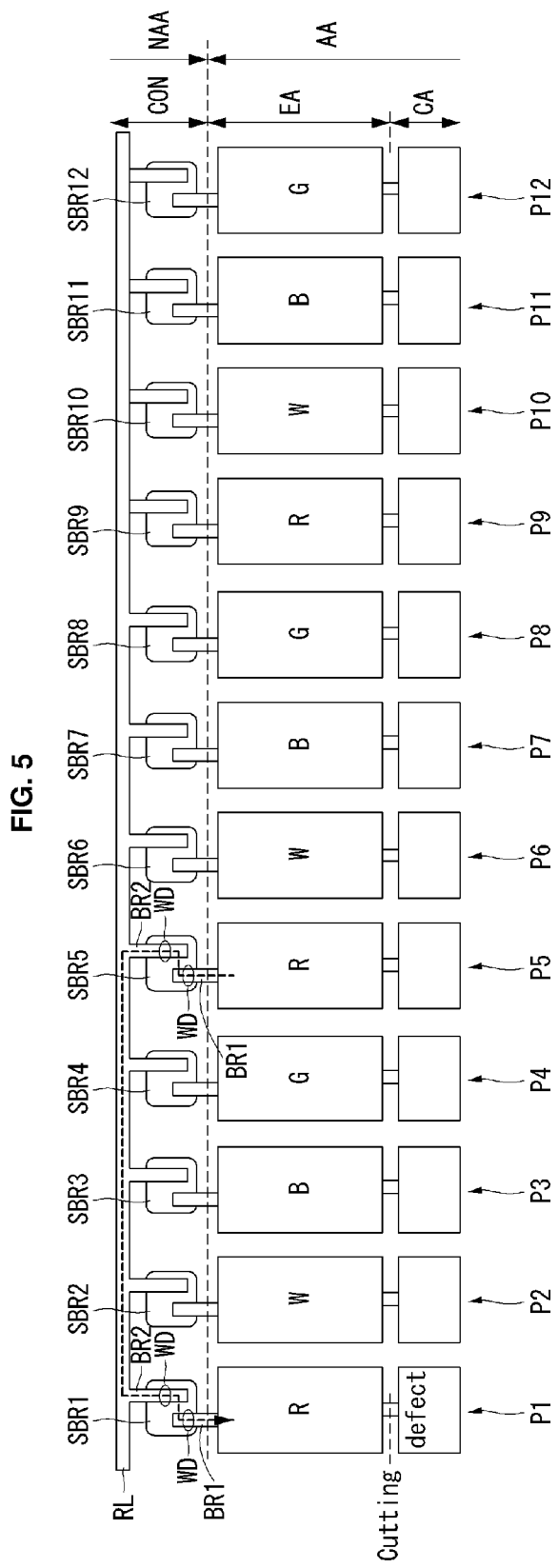
FIG. 5 is a view illustrating a way in which a defective pixel in a pixel array is repaired according to the first aspect of the present disclosure.
Figure 6:
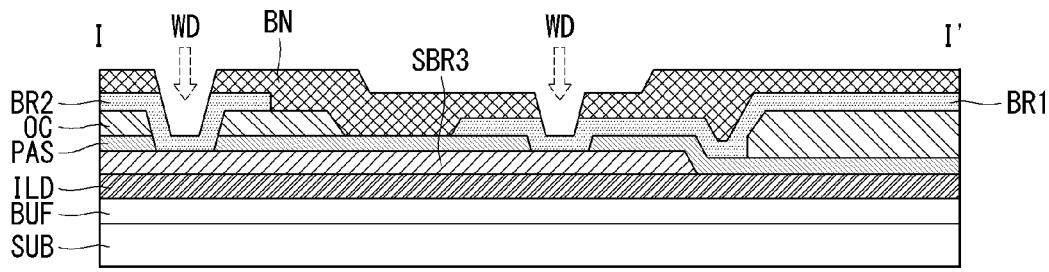
FIG. 6 is a cross-sectional view taken along line I-I' illustrated in FIG. 3 after a welding process.

FIG. 5 is a view illustrating a way in which an array structure is repaired according to a first aspect of the present disclosure, and FIG. 6 is a cross sectional view taken along line I-I' after repairing.

Hereinafter, a repair process will be described when a defect occurs in the circuit portion of the first pixel.

First, the emission part EA of the first pixel P1 may be electrically connected to the repair line RL. To this end, the first bridge pattern BR1 of the first pixel P1 and the first auxiliary bridge SBR1 are electrically connected, and the first auxiliary bridge SBR1 and the second bridge pattern BR2 overlapping the first auxiliary bridge BR1 are also electrically connected. For example, a laser welding, or the like may be used for this process.

Thereafter, the emission part EA of the fifth pixel P5 may be electrically connected to the repair line RL. To this end, the first bridge pattern BR1 of the fifth pixel P5 and the fifth auxiliary bridge SBR5 are electrically connected, and the fifth auxiliary bridge SBR5 and the second bridge pattern BR2 overlapping the fifth auxiliary bridge SBR5 are also electrically connected. In order to electrically connect the emission part EA of the fifth pixel P5 to the repair line RL, a laser welding or the like, for example, may be used for this process, In order to prevent an electric influence that may occur in the circuit part CA of the first pixel P1 from being transmitted to the emission part EA of the first pixel P1, the circuit part CA and the emission part EA of the first pixel P1 may be electrically opened (short-circuited) with respect to each other. Here, the circuit part CA and the emission part EA of the first pixel P1 may be electrically opened with respect to each other by disconnecting the second node N2 to which the anode of the OLED and the source electrode of the driving transistor DT are connected.

Figure 7:
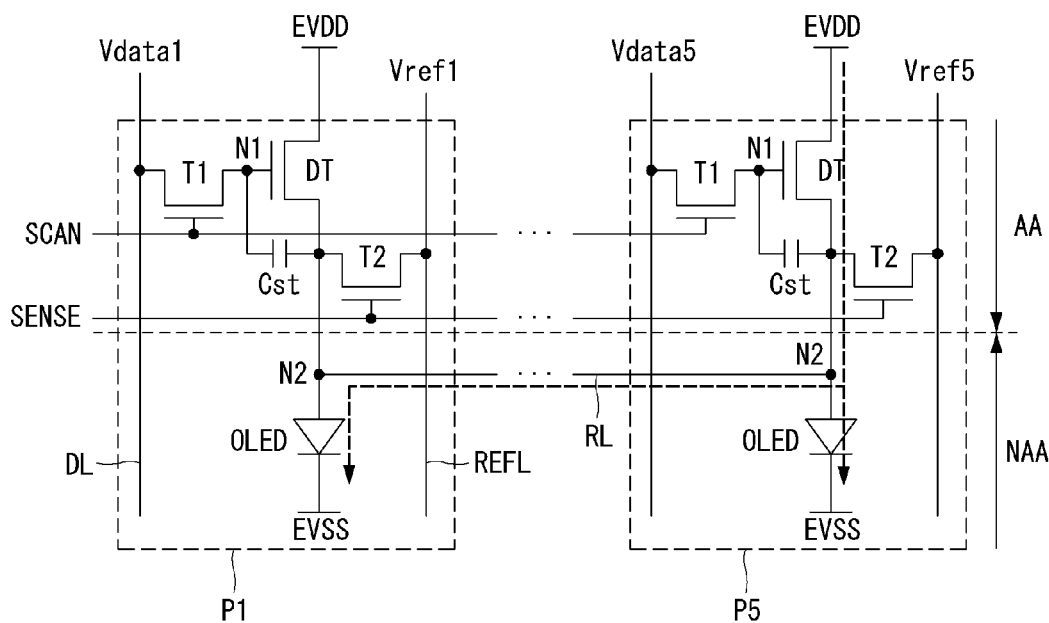
FIG. 7 is an equivalent circuit diagram of first and fifth pixels illustrated in FIG. 5.

FIG. 7 is a view illustrating equivalent circuits of the first pixel P1 to the fifth pixel P5 illustrated in FIG. 5. In case where a defect does not occur, the first pixel P1 represents brightness based on a first data voltage Vdata1 provided through the data line DL and the fifth pixel P5 represents brightness on the basis of a fifth data voltage Vdata5 provided through the data line DL.

Through the repair process illustrated in FIG. 5, the OLED of the first pixel P1 may be electrically open with respect to the circuit part CA and the second node N2 of the first pixel P1 may be electrically connected to the second node N2 of the fifth pixel P5. Accordingly, the OLED of the first pixel P1 represents brightness on the basis of the fifth data voltage Vdata5 as with the fifth pixel P5.

As shown in FIGS. 5 to 7, the OLED of the first pixel P1 is connected to the second node N2 of the fifth pixel P5 because a pixel having the same color nearest to the first pixel P1 is the fifth pixel P5.

That is, adjacent pixels that represent the same color are most likely to represent brightness with the same or very similar data voltage.

Therefore, when a defect occurs in the display panel in which the R, G, and B pixels are sequentially arranged, the first pixel may be electrically connected to the fourth pixel.

Also, although the first pixel P1 and the fifth pixel P5 are illustrated as being connected to each other in FIGS. 5 and 6, the first pixel P1 may be connected to a ninth pixel P9 which is farther.

If a defect occurs in the first pixel P1 and the fifth pixel P5, the circuit parts CA of the first pixel P1 and the fifth pixel P5 are opened and the emission part EA of the first pixel P1, the emission part EA of the fifth pixel P5, and the emission part EA of the ninth pixel P9 are electrically connected to the repair line RL through the afore-mentioned repair process, so that the OLEDs of the first pixel P1 and the fifth pixel P5 may represent the same brightness as that of the ninth pixel P9.

That is, the repair structure according to an aspect of the present disclosure features that the defective pixel is connected to the pixel that emits the same color as that of the defective pixel.

As described above, in the first aspect of the present disclosure, since the data voltage of the same color is applied to the defective pixel, the defective pixel may emit light, without degrading image quality.

If the pixels electrically connected to the defective pixel are limited to the pixels arranged in the column direction in the process of repairing the defective pixel, it may be impossible to repair the pixels arranged in the first pixel line HL1 or the pixels arranged in the nth pixel line HLn. In contrast, in the first aspect, since the pixels disposed in the same pixel line are electrically connected using the repair part CON, pixels disposed at the outermost portions of the display area AA may also be repaired.

Figure 8:
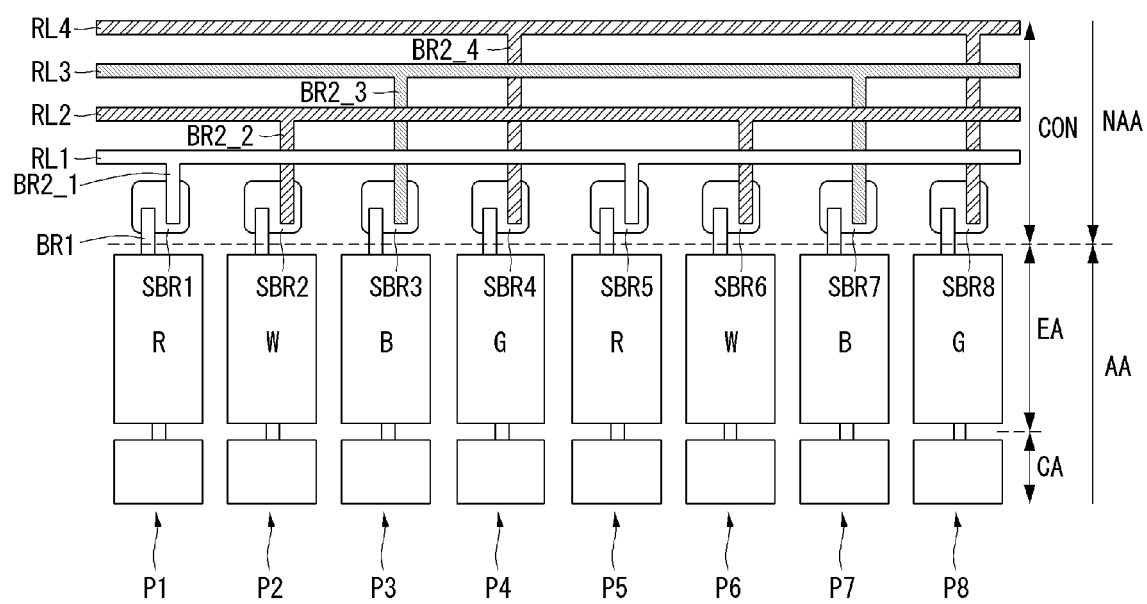
FIG. 8 is a view illustrating a pixel array according to a second aspect of the present disclosure.

FIG. 8 is a view illustrating a pixel array according to a second aspect. Detailed descriptions of the components of FIG. 7 which are substantially the same as those of the first aspect illustrated in FIG. 5 will be omitted.

Referring to FIG. 8, a pixel array according to the second aspect of the present disclosure includes a repair part CON including first to fourth repair lines RL1 to RL4, auxiliary bridges of first to fourth groups, first bridge patterns BR1, and second bridge patterns BR2.

The first to fourth repair lines RL1 to RL4 may be arranged in the non-display area NAA.

The auxiliary bridges SBR1 and SBR5 of the first group correspond to pixels that may represent the R color, respectively. The auxiliary bridges SBR2 and SBR6 of the second group correspond to pixels that represent the W color, respectively. The auxiliary bridges SBR3 and SRB7 of the third group correspond to pixels that may represent the B color. The auxiliary bridges SBR4 and SBR8 of the fourth group correspond to pixels that may represent the G color.

The first bridge patterns BR1 may be connected to the pixels and connected to the auxiliary bridges SBR1 to SBR8.

The second bridge patterns BR2_1, BR2_2, BR2_3, and BR2_4 may include second bridge patterns BR2_1, BR2_2, BR2_3, and BR2_4 of first to fourth groups. The second bridge patterns BR2_1 of the first group may be branched from the first repair line and partially overlap the auxiliary bridges SBR1 and SBR5 of the first group. The second bridge patterns BR2_2 of the second group may be branched from the second repair line and partially overlap the auxiliary bridges SBR2 and SBR6 of the second group. The second bridge patterns BR2_3 of the third group may be branched from the third repair line and partially overlap the auxiliary bridges SBR3 and SBR7 of the third group. The second bridge patterns BR2_4 of the fourth group may be branched from the fourth repair line and partially overlap the auxiliary bridges SBR4 and SBR8 of the fourth group.

In the second aspect of the present disclosure, when there is a defective pixel among the pixels of the R color, the defective pixel and adjacent pixels of the R color are electrically connected by using the first repair line RL1. Similarly, when there is a defective pixel among the pixels of the W color, the defective pixel is repaired using the second repair line RL2. Additionally, when there is a defective pixel among the pixels of the B color, the defective pixel is repaired using the third repair line 3, and when there is a defective pixel among the pixels of the G color, the defective pixel is repaired using the fourth repair line RL4.

The repair part CON of the second aspect of the present disclosure distinguishes among the repair lines to repair each color. As a result, although there are one or more defective pixels, in particular, although a defect occurs in pixels representing different colors, data voltages of different colors are not mixed in defective pixels, and thus, the defective pixels can be repaired, while display quality of an image can be enhanced.

Figure 9:
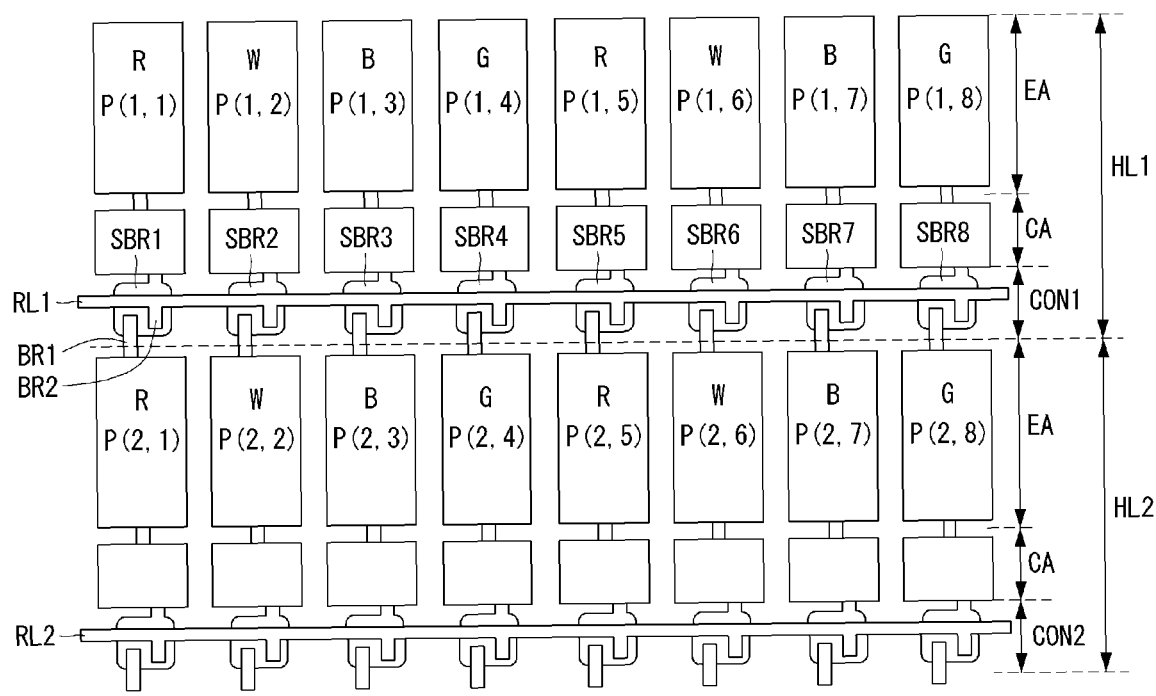
FIG. 9 is a view illustrating a pixel array according to a third aspect of the present disclosure.

FIG. 9 is a view illustrating an array structure according to a third aspect of the present disclosure. Referring to FIG. 9, a repair part CON is disposed in each pixel line. For example, a first pixel line HL1 includes pixels (1,1), P(1,2), P(1,3), P(1,4), P(1,5), P(1,6), P(1,7), and P(1,8) of a first group and a first repair part CON1 arranged in row direction, and a second pixel line HL2 includes pixels P(2,1), P(2,2), P(2,3), P(2,4), P(2,5), P(2,6), P(2,7), and P(2,8) of a second group and a second repair part CON2 arranged in the row direction.

The first repair part CON1 may include a first repair line RL1 and a connection portion. The first repair line RL1 may be disposed along the row direction below the pixels P(1,1), P(1,2), P(1,3), P(1,4), P(1,5), P(1,6), P(1,7), and P(1,8) of the first group.

The connection portion forms a current path connecting a defective pixel P to a normal pixel P. The connection portion may include auxiliary bridges SBR1 to SBR8, first bridge patterns BR1, and second bridge patterns BR2.

The auxiliary bridges SBR1 to SBR8 may be arranged between the pixels P(1,1), P(1,2), P(1,3), P(1,4), P(1,5), P(1,6), P(1,7), and P(1,8) of the first group and the pixels P(2,1), P(2,2), P(2,3), P(2,4), P(2,5), P(2,6), P(2,7), and P(2,8) of the second group and electrically connected to the pixels P(1,1), P(1,2), P(1,3), P(1,4), P(1,5), P(1,6), P(1,7), and P(1,8) of the first group, respectively. For example, the first auxiliary bridge SBR1 is disposed between the pixel P(1,1) and the pixel P(2,1) and is connected to the pixel P(1,1). The second auxiliary bridge SBR2 is disposed between the pixel P(1,2) and the pixel P(2,2) and is connected to the pixel P(1,2). The auxiliary bridges SBR1 to SBR8 may be connected to the anodes of the organic light emitting diodes OLED of the pixels. The auxiliary bridges SBR1 to SBR8 may not be electrically connected to each other.

The first bridge patterns BR1 are electrically connected to emission parts EA of the pixels P(2,1), P(2,2), P(2,3), P(2,4), P(2,5), P(2,6), P(2,7), and P(2,8) of the second group and partially overlap the auxiliary bridges adjacent thereto. For example, the first bridge pattern BR1 connected to the pixel P(2,1) partially overlaps the first auxiliary bridge SBR1 in a plan view. The first bridge pattern BR1 connected to the pixel P(2,2) partially overlaps the second auxiliary bridge SBR2 in a plan view. The first bridge patterns BR1 may be connected to the emission parts EA of the pixels, specifically, the anodes of the OLEDs.

Each of the second bridge patterns BR2 may be branched from the first repair line RL1 and may partially overlap the auxiliary bridges adjacent thereto. For example, the second bridge pattern BR2 adjacent to the pixel P(2,1) partially overlaps the first auxiliary bridge SBR1 shown in a plan view, and the second bridge pattern BR2 adjacent to the pixel P(2,2) partially overlaps the second auxiliary bridge SBR2 shown in a plan view. The second bridge patterns BR2 may be formed using the same metal layer as the repair line RL and may be branched from the repair line RL.

A second repair part CON2 arranged between the pixels P(2,1), P(2,2), P(2,3), P(2,4), P(2,5), P(2,6), P(2,7), and P(2,8) of the second group and pixels of a third group (not shown) may be formed to have the same pattern as the first repair part CON1.

Figure 10:
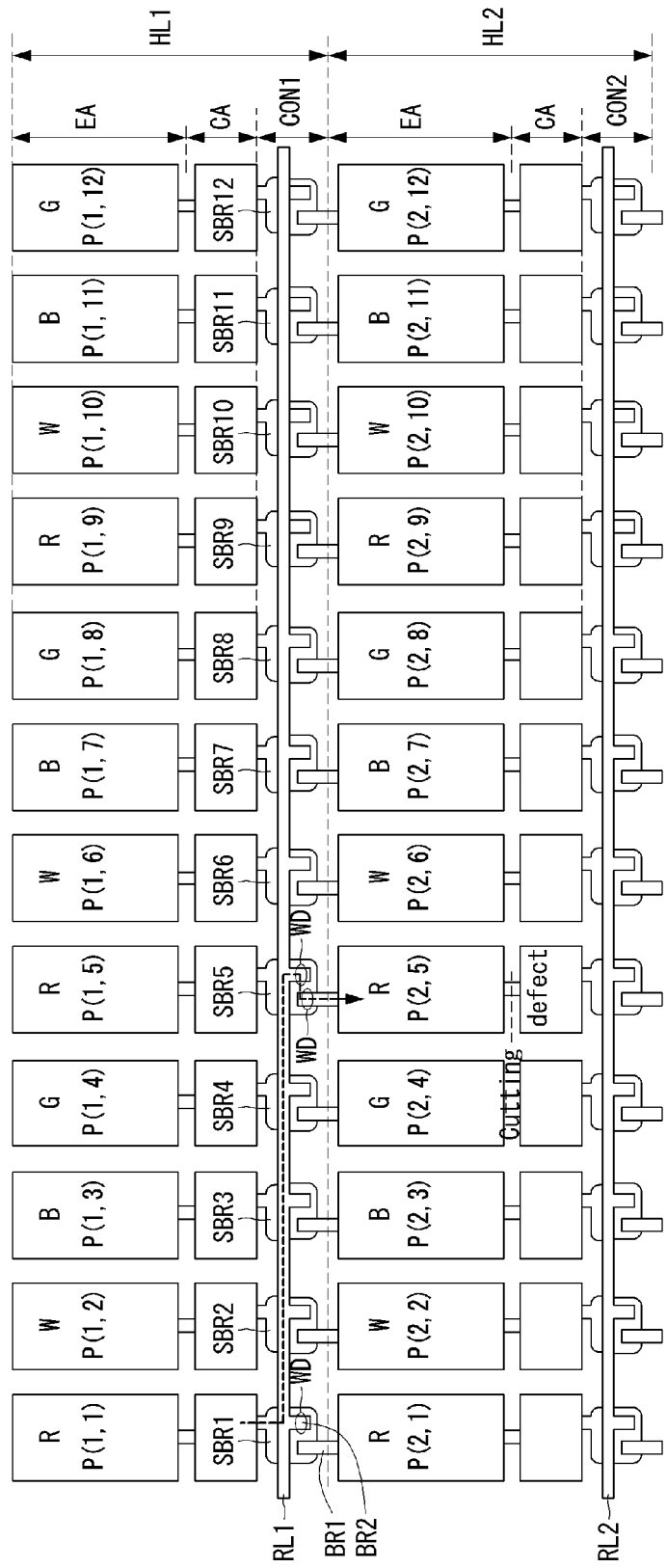
FIG. 10 is a view illustrating a way in which a defective pixel in a pixel array is repaired according to the third aspect of the present disclosure.

FIG. 10 is a view illustrating a repair process using pixels arranged in different pixel lines in an array structure according to a third aspect of the present disclosure. FIG. 10 shows a case where a circuit part (CA) of a pixel P(2,5) is defective. Reference numerals of the repair part shown in FIG. 10 are the same as those illustrated in FIG. 9.

Referring to FIGS. 9 and 10, the second node N2 of the pixel P(1,1) is electrically connected to the repair line RL. To this end, the first auxiliary bridge SBR1 and the second bridge pattern BR2 overlapping the first auxiliary bridge SBR1 are electrically connected. Here, the first auxiliary bridge SBR1 and the second bridge pattern BR2 may be connected through a process such as laser welding, or the like.

Also, the second node N2 of the pixel P(2,5) is electrically connected to the repair line RL. To this end, the fifth auxiliary bridge SBR5 and the second bridge pattern BR2 overlapping the fifth auxiliary bridge SBR5 are electrically connected, and the fifth auxiliary bridge SRB5 and the first bridge pattern BR1 connected to the pixel P(2,5) are electrically connected. Here, a process such as laser welding, or the like, may be used to electrically connect the fifth auxiliary bridge SBR5 and the second bridge pattern BR2 and to electrically connect the fifth auxiliary bridge SBR5 and the first bridge pattern BR1.

In order to prevent an electric influence generated in the circuit part CA of the pixel P(2,5) from being transmitted to the emission part EA of the second pixel P2, the circuit part CA and the emission part EA of the pixel P(2,5) are electrically opened with respect to each other. The circuit part CA and the emission part EA of the pixel P(2,5) may be electrically opened with respect to each other by disconnecting the second node N2 to which the anode of the OLED and the source electrode of the driving transistor DT are connected.

In the third aspect of the present disclosure, although one or more pixels are defective in one pixel line in the display area AA, the defective pixels may be repaired, without degrading display quality.

FIG. 10 shows an example in which the circuit part CA of the pixel P(1,1) is connected to an emission part EA of the pixel P(2,5) which is a defective pixel. A normal pixel connected to a defective pixel to repair the defective pixel may not be the nearest pixel. For example, when the pixel P(2,5) and the pixel P(2,9) are defective, the respective circuit parts CA of the defective pixels P(2,5) and P(2,9) may be opened and the circuit part CA of the pixel P(1,1) and the respective emission parts EA of the pixel P(2,5) and the pixel P(2,9) may be connected to the repair line RL through a repair process. As a result, the respective organic light emitting diodes OLED of the pixel P(2,5) and the pixel P(2,9) represent the same brightness as that of the pixel P(1,1).

Figure 11:
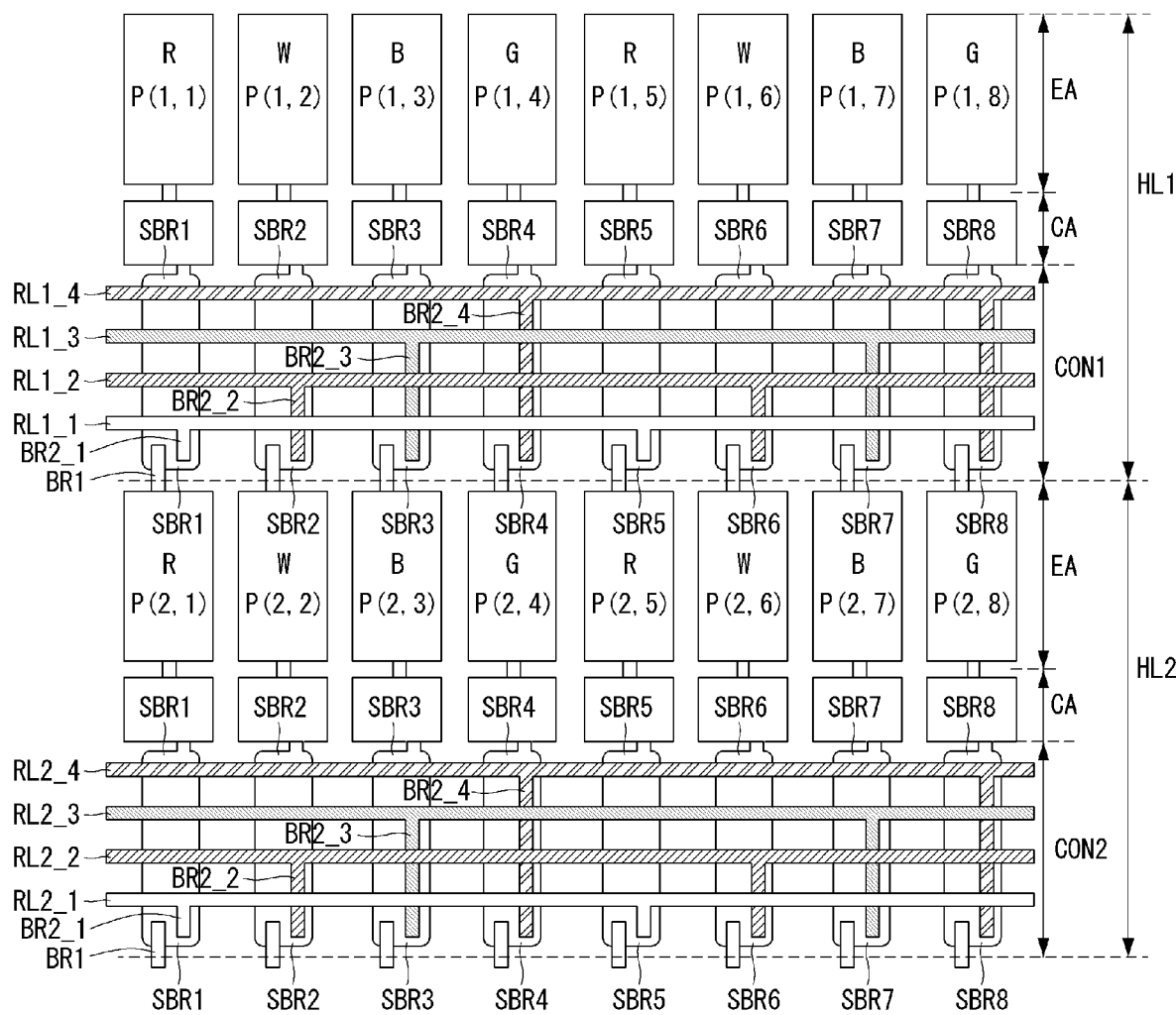
FIG. 11 is a view illustrating a pixel array according to a fourth aspect of the present disclosure.

FIG. 11 is a view illustrating a pixel array according to a fourth aspect of the present disclosure. A description of the components in the fourth aspect of the present disclosure, which are substantially the same as those in the above-described aspects will be omitted.

Referring to FIG. 11, a pixel array according to the fourth aspect of the present disclosure includes a first repair part CON1 disposed in the first pixel line HL1 and a second repair part CON2 disposed in the second pixel line HL2.

The first repair part CON1 includes first repair lines RL1 and a connection portion. The first repair lines RL1 are arranged in a row direction below pixels P(1,1), P(1,2), P(1,3), P(1,4), P(1,5), P(1,6), P(1,7), P(1,8) of a first group.

The connection portion forms a current path connecting a defective pixel P to a normal pixel P. The connection portion includes auxiliary bridges SBR1 to SBR8, first bridge patterns BR1, and second bridge patterns BR2.

The auxiliary bridges SBR1 and SBR5 of the first group correspond to the pixels that represent the R color. The auxiliary bridges SBR2 and SBR6 of a second group correspond to pixels that represent the W color, respectively. The auxiliary bridges SBR3 and SBR7 of a third group correspond to pixels that represent the B color, respectively. The auxiliary bridges SBR4 and SBR8 of a fourth group correspond to pixels that represent the G color. The first bridge patterns BR1 are connected to the pixels and connected to the auxiliary bridges SBR1 through SBR8.

The second bridge patterns BR2_1, BR2_2, BR2_3, and BR2_4 include first to fourth groups of second bridge patterns BR2_1, BR2_2, BR2_3, and BR2_4. The second bridge patterns BR2_1 of the first group are branched from the first repair line and overlap the auxiliary bridges SBR1 and SBR5 of the first group. The second bridge patterns BR2_2 of the second group are branched from the second repair line and overlap the auxiliary bridges SBR2 and SBR6 of the second group. The second bridge patterns BR2_3 of the third group branches from the third repair line and overlap the auxiliary bridges SBR3 and SBR7 of the third group. The second bridge patterns BR2_4 of the fourth group branches from the fourth repair line and overlap the auxiliary bridges SBR4 and SBR8 of the fourth group.

In the fourth aspect of the present disclosure, a defective pixel may be repaired per color of each of the pixels arranged in all the pixel lines.

According to the present disclosure described above, by applying a data voltage of a pixel adjacent to a defective pixel, the defective pixel may display an image.

According to the present disclosure described above, by writing a data voltage of a pixel representing the same color, rather than a pixel immediately adjacent to a defective pixel using the repair line, image display quality may be enhanced.

In particular, according to the present disclosure described above, by writing a data voltage of a pixel disposed in the same row direction as a defective pixel into the defective pixel using the repair line, repairing may be easily performed although a defect occurs in pixels arranged in a pixel line adjacent to the non-display area.

Although aspects have been described with reference to a number of illustrative aspects thereof, it should be understood that numerous other modifications and aspects can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting display panel comprising:
a plurality of pixels arranged in a row direction;
a first repair line disposed in the row direction;
a plurality of auxiliary bridges, each arranged between the first repair line and each of the plurality of pixels;
a plurality of first bridge patterns respectively connected to the plurality of pixels and each first bridge pattern partially overlapping each adjacent auxiliary bridge;
a plurality of second bridge patterns branched from the first repair line and each second bridge pattern partially overlapping each adjacent auxiliary bridge,
wherein the auxiliary bridge is disposed on an inter-layer dielectric layer formed on a substrate, and a passivation layer is disposed on the auxiliary bridge and the inter-layer dielectric layer,
the first bridge pattern is disposed on the passivation layer and an overcoat layer in a first area that does not overlap with the auxiliary bridge and on the passivation layer in a second area partially overlapping with the auxiliary bridge where the overcoat layer is removed, and
the second bridge pattern is disposed on the overcoat layer and the passivation layer in a third area partially overlapping with the same auxiliary bridge as the first bridge pattern, and
a bank layer is located on the substrate where the first bridge pattern and the second bridge pattern are formed thereon,
wherein the first bridge pattern in the second area is electrically connected with the auxiliary bridge where the bank layer and the passivation layer are removed, and
the second bridge pattern in the third area is electrically connected with the auxiliary bridge where the bank layer, the overcoat layer and the passivation layer are removed.

2. The organic light emitting display panel of claim 1, wherein the plurality of pixels includes an organic light emitting diode (OLED), and the plurality of first bridge patterns is electrically connected to an anode of the OLED.

3. The organic light emitting display panel of claim 1, wherein the plurality of auxiliary bridges respectively corresponds to the plurality of pixels and is electrically insulated from each other.

4. The organic light emitting display panel of claim 2, wherein the plurality of pixels includes a driving transistor that drives the OLED, and the plurality of auxiliary bridges is formed of a same material layer as source and drain electrodes of the driving transistor.

5. The organic light emitting display panel of claim 2, wherein the first repair line is formed of a same metal layer as the anode of the OLED.

6. The organic light emitting display panel of claim 2, wherein the first repair line and the plurality of auxiliary bridges are arranged in a non-display area.

7. The organic light emitting display panel of claim 6, wherein the plurality of pixels includes a first pixel and a second pixel representing a same color.

8. The organic light emitting display panel of claim 7, wherein the plurality of auxiliary bridges includes a first auxiliary bridge adjacent to the first pixel and a second auxiliary bridge adjacent to the second pixel, and
wherein, when the first pixel is defective, the first bridge pattern connected to the first pixel and the second bridge pattern overlapping the first auxiliary bridge are welded to the first auxiliary bridge, and the first bridge pattern connected to the second pixel and the second bridge pattern overlapping the second auxiliary bridge are welded to the second auxiliary bridge.

9. The organic light emitting display panel of claim 7, wherein the anode of the OLED included in the first pixel is electrically opened with respect to a driving transistor which drives the OLED.

10. The organic light emitting display panel of claim 6, wherein the plurality of pixels includes a first group of pixels representing a first color and a second group of pixels representing a second color, and a second repair line adjacent to the first repair line,
wherein the plurality of first bridge patterns is connected to the first and second groups of pixels,
wherein the plurality of auxiliary bridges includes a first group of the auxiliary bridges partially overlapping the first group of the first bridge patterns and a second group of the auxiliary bridges partially overlapping the second group of the first bridge patterns, and
wherein the plurality of second bridge patterns includes a first group of second bridge patterns branched from the first repair line and partially overlapping the first group of the auxiliary bridges; and a second group of the second bridge patterns branched from the second repair line and partially overlapping the second group of the auxiliary bridges.

11. The organic light emitting display panel of claim 2, wherein the plurality of pixels includes a first group of pixels arranged in a row direction in a display area and a second group of pixels arranged in a different row from the first group of pixels, and the first repair line is disposed between the first group of pixels and the second group of pixels.

12. The organic light emitting display panel of claim 11, wherein the plurality of pixels includes an OLED, and the auxiliary bridges are respectively connected to the OLEDs included in the pixels of the first group.

13. The organic light emitting display panel of claim 12, wherein the first group of pixels includes a first pixel and the second group of pixels includes a second pixel, wherein the first pixel and the second pixel represent a same color,
wherein the plurality of auxiliary bridges includes a first auxiliary bridge connected to the first pixel and a second auxiliary bridge adjacent to the second pixel, and wherein, when the first pixel is defective, the first bridge pattern connected to the first pixel and the second bridge pattern overlapping the first auxiliary bridge are welded to the first auxiliary bridge, and the second bridge pattern overlapping the second auxiliary bridge is welded to the second auxiliary bridge.

14. The organic light emitting display panel of claim 12, wherein the plurality of pixels includes a first group of pixels representing a first color and a second group of pixels representing a second color and a second repair line adjacent to the first repair line,
wherein the plurality of first bridge patterns is connected to the first and second groups of pixels,
wherein the plurality of auxiliary bridges includes a first group of auxiliary bridges partially overlapping the first group of the first bridge patterns and a second group of auxiliary bridges partially overlapping the second group of the first bridge patterns, and
wherein the plurality of second bridge patterns includes a first group of second bridge patterns branched from the first repair line and overlapping the first group of the auxiliary bridges and a second group of second bridge patterns branched from the second repair line and overlapping the second group of the auxiliary bridges.

15. A method for repairing an organic light emitting display panel, the repairing an organic light emitting display panel comprising:
pixels arranged in a row direction;
a first repair line disposed in the row direction;
auxiliary bridges arranged between the first repair line and the pixels;
first bridge patterns connected to the pixels, respectively, and partially overlapping the auxiliary bridges adjacent thereto; and
second bridge patterns branched from the first repair line and partially overlapping the auxiliary bridges, respectively, and the method comprising:
by electrically connecting the first bridge pattern of a defective pixel to the auxiliary bridge adjacent to the first bridge pattern and electrically connecting the auxiliary bridge to the second bridge pattern adjacent to the auxiliary bridge, electrically connecting an emission part of the defective pixel to the first repair line;
disconnecting the emission part of the defective pixel from a circuit part of the defective pixel; and
by electrically connecting the first bridge pattern of a normal pixel, that is adjacent to the defective pixel and represents the same color as the defective pixel, to the auxiliary bridge adjacent to the first bridge pattern and electrically connecting the auxiliary bridge to the second bridge pattern adjacent to the auxiliary bridge, electrically connecting an emission part of the normal pixel to the first repair line.

* * * * *